United States Patent [19]
Barkan et al.

[11] Patent Number: 4,802,111
[45] Date of Patent: Jan. 31, 1989

[54] CASCADABLE DIGITAL FILTER PROCESSOR EMPLOYING MOVING COEFFICIENTS

[75] Inventors: Mordecai Barkan, Palo Alto, Calif.; Alex Genusov; Michael Granski, both of Haifa, Israel; Paul Budnik, Los Gatos, Calif.; Refael Retter, Haifa, Israel

[73] Assignee: Zoran Corporation, Santa Clara, Calif.

[21] Appl. No.: 841,299

[22] Filed: Mar. 10, 1986

[51] Int. Cl.$^4$ ............................................. G06F 7/38
[52] U.S. Cl. ............................ 364/724.1; 364/724.13
[58] Field of Search .................. 364/724, 728; 375/96, 375/103

[56] References Cited

U.S. PATENT DOCUMENTS

| | | | |
|---|---|---|---|
| 4,323,980 | 4/1982 | Houdard et al. | 364/724 |
| 4,346,475 | 8/1982 | Alexis | 364/728 |
| 4,493,048 | 1/1985 | Kung et al. | 364/724 |
| 4,546,445 | 10/1985 | Haugen | 364/728 |
| 4,584,659 | 4/1986 | Stikvoort | 364/724 |
| 4,646,327 | 2/1987 | Kojima et al. | 364/724 |

OTHER PUBLICATIONS

H. T. Kung, *Why Systolic Architectures?*, Computer, vol. 15, No. 1, Jan. 82, pp. 37-46, IEEE, Long Beach, CA.

*Primary Examiner*—Gary V. Harkcom
*Assistant Examiner*—Long Thanh Nguyen
*Attorney, Agent, or Firm*—Flehr, Hohbach, Test, Albritton & Herbert

[57] ABSTRACT

A digital filter processor employs four multiplier-accumulator cells and an output accumulator for receiving and accumulating all cell outputs. Data is provided to all cells in parallel, and finite impulse coefficients are applied serially to all cells. A plurality of registers and at least one multiplexer interconnect the cells for transmitting the coefficients between cells. The registers can be employed for sample rate reduction or decimation. A plurality of processors can be cascaded for processing an increased number of coefficients without a reduction in sample time. Alternatively, data can be recycled in a processor to accommodate a number of coefficients greater than the number of cells at a reduced sampled sample rate. A cell address is provided for selecting cell outputs during the reading of the filtered/processed data.

11 Claims, 12 Drawing Sheets

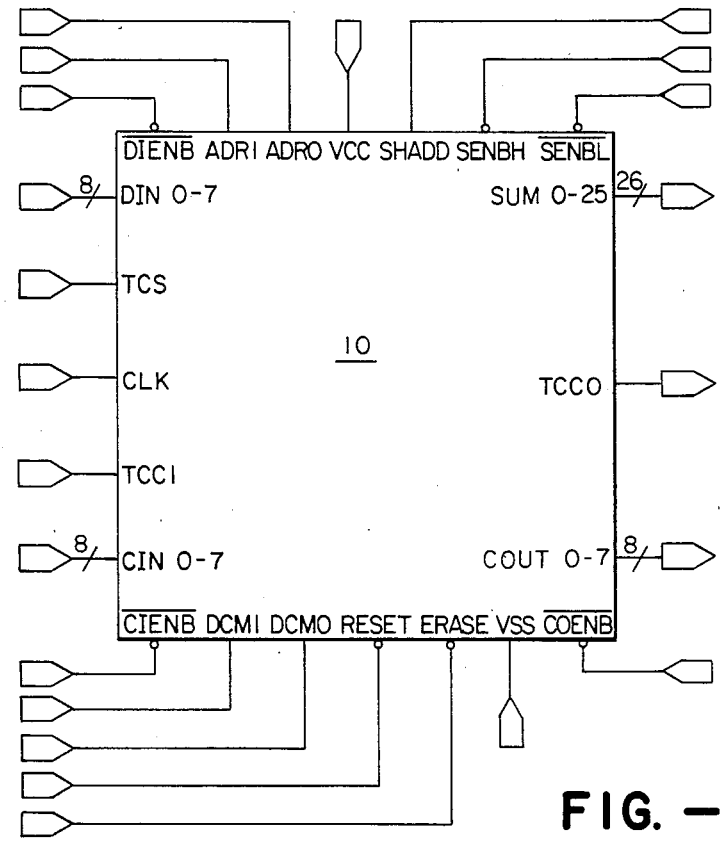
FIG. —1
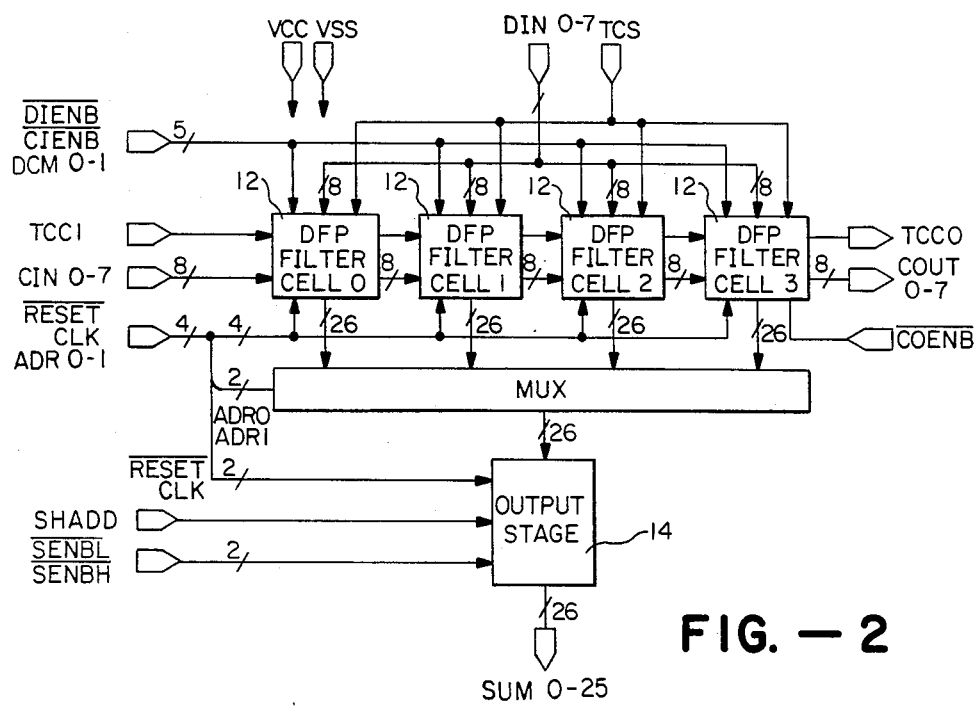
FIG. —2

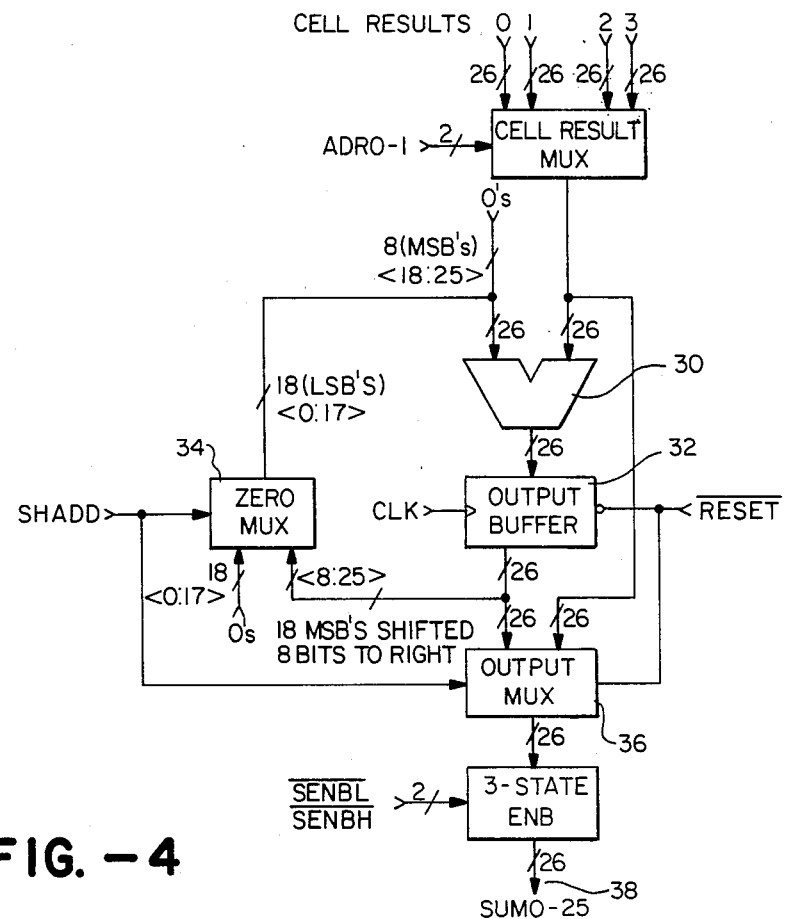

FIG. -4

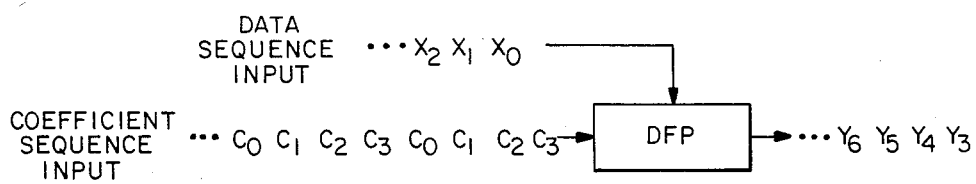

| CLK | CELL 0 | CELL 1 | CELL 2 | CELL 3 | SUM/CLR |
|---|---|---|---|---|---|
| 0 | $C_3 \cdot X_0$ | 0 | 0 | 0 | — |
| 1 | $+C_2 \cdot X_1$ | $C_3 \cdot X_1$ | 0 | 0 | — |
| 2 | $+C_1 \cdot X_2$ | $+C_2 \cdot X_2$ | $C_3 \cdot X_2$ | 0 | — |
| 3 | $+C_0 \cdot X_3$ | $+C_1 \cdot X_3$ | $+C_2 \cdot X_3$ | $C_3 \cdot X_3$ | CELL 0 (Y3) |
| 4 | $C_3 \cdot X_4$ | $+C_0 \cdot X_4$ | $+C_1 \cdot X_4$ | $+C_2 \cdot X_4$ | CELL 1 (Y4) |
| 5 | $+C_2 \cdot X_5$ | $C_3 \cdot X_5$ | $+C_0 \cdot X_5$ | $+C_1 \cdot X_5$ | CELL 2 (Y5) |
| 6 | $+C_1 \cdot X_6$ | $+C_2 \cdot X_6$ | $C_3 \cdot X_6$ | $+C_0 \cdot X_6$ | CELL 3 (Y6) |
| 7 | $+C_0 \cdot X_7$ | $+C_1 \cdot X_7$ | $+C_2 \cdot X_7$ | $C_3 \cdot X_7$ | CELL 0 (Y7) |

FIG. -5

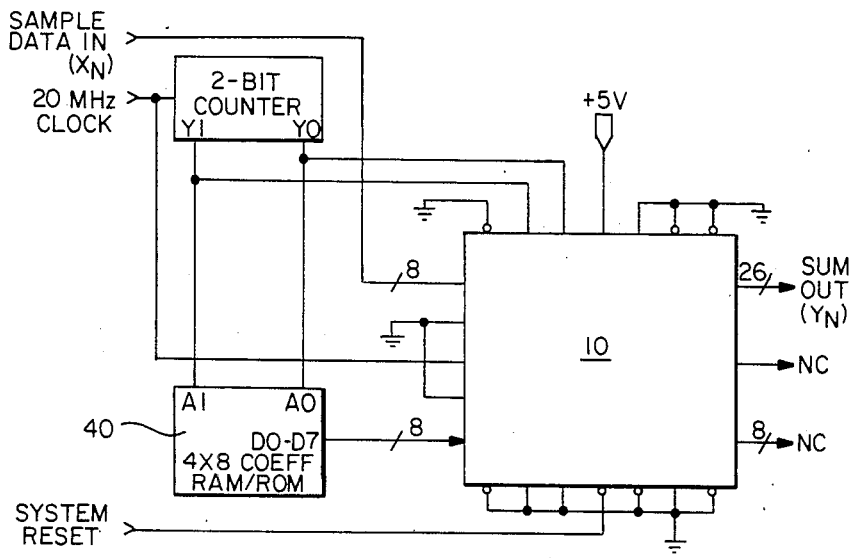

FIG. —6

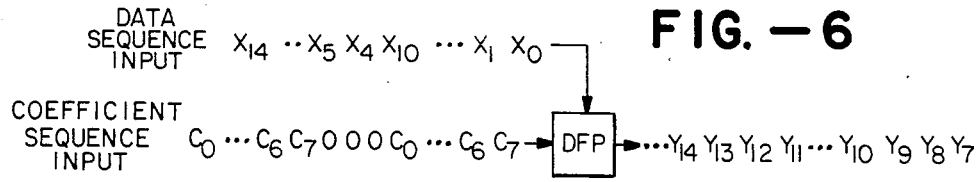

| CLK | CELL 0 | CELL 1 | CELL 2 | CELL 3 | SUM/CLR |
|---|---|---|---|---|---|
| 0 | $C_7 \cdot X_0$ | 0 | 0 | 0 | — |
| 1 | $+C_6 \cdot X_1$ | $C_7 \cdot X_1$ | 0 | 0 | — |
| 2 | $+C_5 \cdot X_2$ | $+C_6 \cdot X_2$ | $C_7 \cdot X_2$ | 0 | — |
| 3 | $+C_4 \cdot X_3$ | $+C_5 \cdot X_3$ | $+C_6 \cdot X_3$ | $C_7 \cdot X_3$ | — |
| 4 | $+C_3 \cdot X_4$ | $+C_4 \cdot X_4$ | $+C_5 \cdot X_4$ | $+C_6 \cdot X_4$ | — |
| 5 | $+C_2 \cdot X_5$ | $+C_3 \cdot X_5$ | $+C_4 \cdot X_5$ | $+C_5 \cdot X_5$ | — |
| 6 | $+C_1 \cdot X_6$ | $+C_2 \cdot X_6$ | $+C_3 \cdot X_6$ | $+C_4 \cdot X_6$ | — |
| 7 | $+C_0 \cdot X_7$ | $+C_1 \cdot X_7$ | $+C_2 \cdot X_7$ | $+C_3 \cdot X_7$ | CELL 0 (Y7) |
| 8 | 0 | $+C_0 \cdot X_8$ | $+C_1 \cdot X_8$ | $+C_2 \cdot X_8$ | CELL 1 (Y8) |
| 9 | 0 | 0 | $+C_0 \cdot X_9$ | $+C_1 \cdot X_9$ | CELL 2 (Y9) |
| 10 | 0 | 0 | 0 | $+C_0 \cdot X_{10}$ | CELL 3 (Y10) |
| 11 | $C_7 \cdot X_4$ | 0 | 0 | 0 | — |
| 12 | $+C_6 \cdot X_5$ | $C_7 \cdot X_5$ | 0 | 0 | — |
| 13 | $+C_5 \cdot X_6$ | $+C_6 \cdot X_6$ | $C_7 \cdot X_6$ | 0 | — |
| 14 | $+C_4 \cdot X_7$ | $+C_5 \cdot X_7$ | $+C_6 \cdot X_7$ | $C_7 \cdot X_7$ | — |
| 15 | $+C_3 \cdot X_8$ | $+C_4 \cdot X_8$ | $+C_5 \cdot X_8$ | $+C_6 \cdot X_8$ | — |
| 16 | $+C_2 \cdot X_9$ | $+C_3 \cdot X_9$ | $+C_4 \cdot X_9$ | $+C_5 \cdot X_9$ | — |
| 17 | $+C_1 \cdot X_{10}$ | $+C_2 \cdot X_{10}$ | $+C_3 \cdot X_{10}$ | $+C_4 \cdot X_{10}$ | — |
| 18 | $+C_0 \cdot X_{11}$ | $+C_1 \cdot X_{11}$ | $+C_2 \cdot X_{11}$ | $+C_3 \cdot X_{11}$ | CELL 0 (Y11) |
| 19 | 0 | $+C_0 \cdot X_{12}$ | $+C_1 \cdot X_{12}$ | $+C_2 \cdot X_{12}$ | CELL 1 (Y12) |
| 20 | 0 | 0 | $+C_0 \cdot X_{13}$ | $+C_1 \cdot X_{13}$ | CELL 2 (Y13) |
| 21 | 0 | 0 | 0 | $+C_0 \cdot X_{14}$ | CELL 3 (Y14) |

FIG. —10

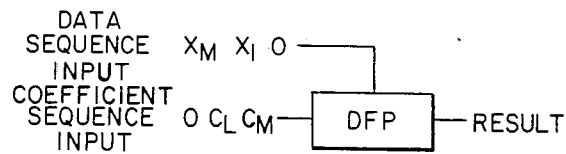

| CLK | CELL 0 | CELL 1 | CELL 2 | CELL 3 | OUTBUF |
|---|---|---|---|---|---|
| 0 | $C$ | 0 | 0 | 0 | — |
| 1 | $+C_L \cdot X_L$ | $C_M \cdot X_L$ | 0 | 0 | — |
| 2 | | $+C_L \cdot X_M$ | $C_M \cdot X_M$ | 0 | — |
| 3 | | | | | $C_L \cdot X_L$ |
| 4 | | | | | $C_L \cdot X_L + C_M \cdot X_L$ $+C_L \cdot X_M$ |
| 5 | | | | | $C_L \cdot X_L + C_M \cdot X_L$ $+C_L \cdot X_M + C_M \cdot X_M$ |

FIG.—12

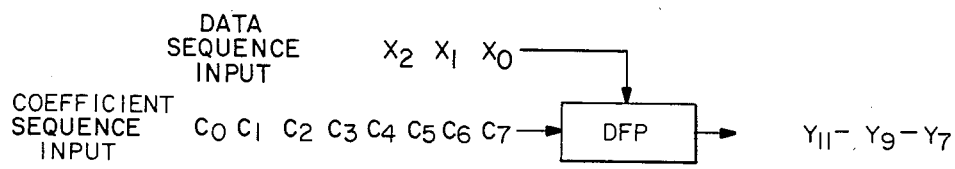

| CLK | CELL 0 | CELL 1 | CELL 2 | CELL 3 | SUM/CLR |
|---|---|---|---|---|---|
| 0 | $C_7 \cdot X_0$ | 0 | | | — |
| 1 | $+C_6 \cdot X_1$ | 0 | | | — |
| 2 | $+C_5 \cdot X_2$ | $C_7 \cdot X_2$ | | | — |
| 3 | $+C_4 \cdot X_3$ | $+C_6 \cdot X_3$ | | | — |
| 4 | $+C_3 \cdot X_4$ | $+C_5 \cdot X_4$ | $C_7 \cdot X_4$ | | — |
| 5 | $+C_2 \cdot X_5$ | $+C_4 \cdot X_5$ | $+C_6 \cdot X_5$ | | — |
| 6 | $+C_1 \cdot X_6$ | $+C_3 \cdot X_6$ | $+C_5 \cdot X_6$ | $C_7 \cdot X_6$ | — |
| 7 | $+C_0 \cdot X_7$ | $+C_2 \cdot X_7$ | $+C_4 \cdot X_7$ | $+C_6 \cdot X_7$ | CELL 0 (Y7) |
| 8 | $C_7 \cdot X_8$ | $+C_1 \cdot X_8$ | $+C_3 \cdot X_8$ | $+C_5 \cdot X_8$ | — |
| 9 | $+C_6 \cdot X_9$ | $+C_0 \cdot X_9$ | $+C_2 \cdot X_9$ | $+C_4 \cdot X_9$ | CELL 1 (Y9) |
| 10 | $+C_5 \cdot X_{10}$ | | $+C_1 \cdot X_{10}$ | $+C_3 \cdot X_{10}$ | — |
| 11 | $+C_4 \cdot X_{11}$ | | $+C_0 \cdot X_{11}$ | $+C_2 \cdot X_{11}$ | CELL 2 (Y11) |
| 12 | $+C_3 \cdot X_{12}$ | | | $+C_1 \cdot X_{12}$ | — |
| 13 | $+C_2 \cdot X_{13}$ | | | $+C_0 \cdot X_{13}$ | CELL 3 (Y12) |
| 14 | $+C_1 \cdot X_{14}$ | | | | — |
| 15 | $+C_0 \cdot X_{15}$ | | | | |

FIG.—14

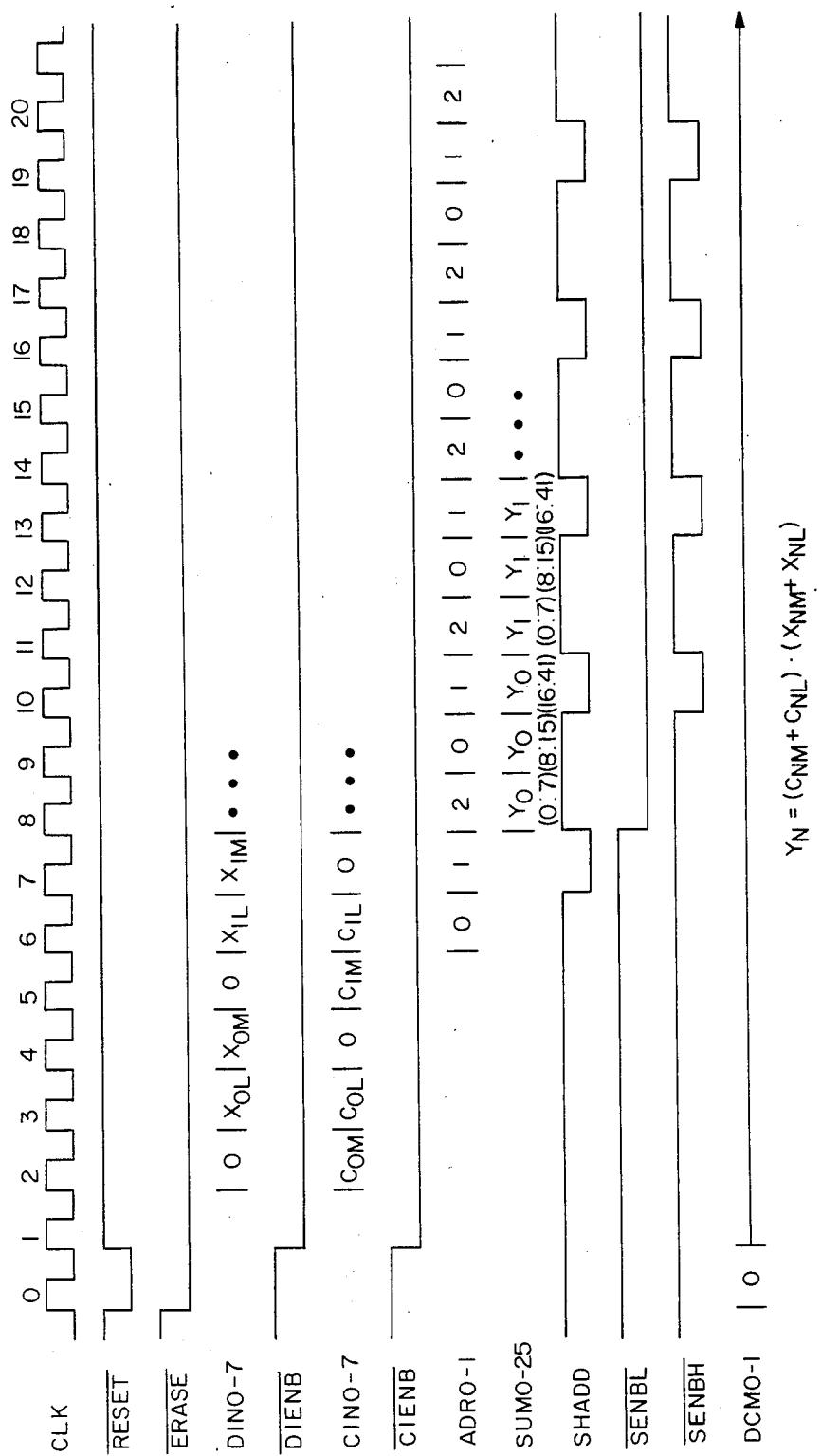

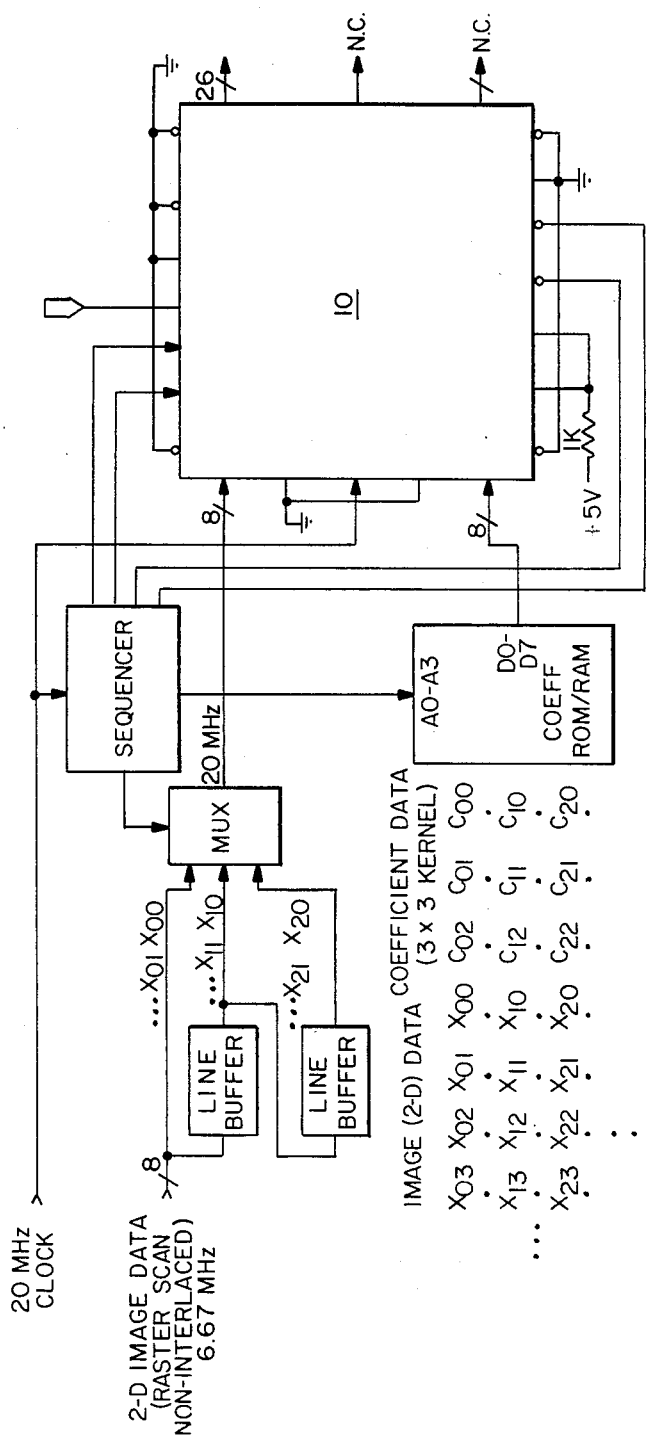
FIG. —16

CASCADABLE DIGITAL FILTER PROCESSOR EMPLOYING MOVING COEFFICIENTS

BACKGROUND OF THE INVENTION

This invention relates generally to dedicated systolic processing arrays, and more particularly the invention relates to a pipelined digital filter processor employing moving coefficients.

The digital filter processor (DFP), also referred to as a finite impulse response (FIR) processor or convolver, forms vector operations in the form of $$Y_n = \sum_{i=0}^{k-1} X_{n-i} C_i$$

where
$X_{n-i}$—input samples
$Y_n$—output filtered signal
$c_i$—filter coefficients
k—filter length, number of taps A number of DFP integrated circuits are commercially available. Typically, sampled data is fed sequentially to multipliers having fixed coefficients, and the partial products are then summed and outputed.

SUMMARY OF THE INVENTION

An object of the present invention is a DFP having increased processing speed.

Another object of the invention is a DFP circuit which is flexible in application.

Still another object of the invention is a DFP circuit having a plurality of multiplier accumulators that are accessible through a common bus, and may operate in four modes according to the number representation (i.e. 2's complement, unsigned and mixed modes) of the multiplicands.

Another object of the invention is a DFP circuit which can be cascaded for operation on data with greater filter lengths.

Yet another of the invention is a DFP circuit that can perform sample rate reduction or decimation.

Another object of the invention is a DFP circuit that can be concatenated for longer word length of data and coefficients.

Briefly, a DFP circuit in accordance with the invention includes a plurality of cells organized to operate on data, that enters all the cells in parallel and includes a sign mode bit for 2's complement or unsigned representation, with filter coefficients being pipelined to the individual cells as the data is supplied in parallel to the cells. Each cell has a multiplier/accumulator (MAC), and each MAC is connected through a common multiplex bus (MUX) to a cell output/accumulator.

Filters of increased lengths can be created by cascading together several DFP circuits or by recycling in a single circuit. By using multiple circuits the sample rate need not be reduced. By recycling data in a one or more circuits the increased filter length is accommodated by reducing sample rate. The circuits can be operated in parallel to get maximum sample rate by computing partial products and then adding to obtain a final result.

Coefficients in each cell are connected to adjacent cells through a plurality of registers and multiplexers. The registers allow the coefficients to be delayed through the cell by one or more clocks for resampling or decimation for rate reduction. The decimation registers can be employed also to provide convolution of image points. The coefficients and data include a sign mode bit which specifies the 2's complement or unsigned number representation.

The invention and objects and features thereof will be more readily apparent from the following detailed description and appended claims when taken with the drawing.

BRIEF DESCRIPTION OF THE DRAWING

FIG. 1 is a logic symbol and signal identification for a DFP circuit in accordance with one embodiment of the invention.

FIG. 2 is a functional block diagram of the DFP of FIG. 1.

FIG. 4 is a functional block diagram of the output stage of the DFP circuit of FIG. 2.

FIG. 5 is a table illustrating operation of the DFP circuit of FIG. 2 in a simple four tap filter mode of operation.

FIG. 6 is a schematic of the four tap filter operation using the logic symbol of FIG. 1.

FIG. 10 is a table illustrating operation of the single circuit for implementation of an eight tap filter.

FIG. 12 is a table illustrating operation of a single DFP circuit with word size extension.

FIG. 13 is a timing diagram of the operation illustrated in the table of FIG. 12.

FIG. 14 is a table illustrating operation of the circuitry of FIG. 2 in a decimate by two mode of operation.

FIG. 16 is a schematic diagram of the circuitry of FIG. 2 for image convolution.

DETAILED DESCRIPTION OF ILLUSTRATIVE EMBODIMENTS

Figure 3:
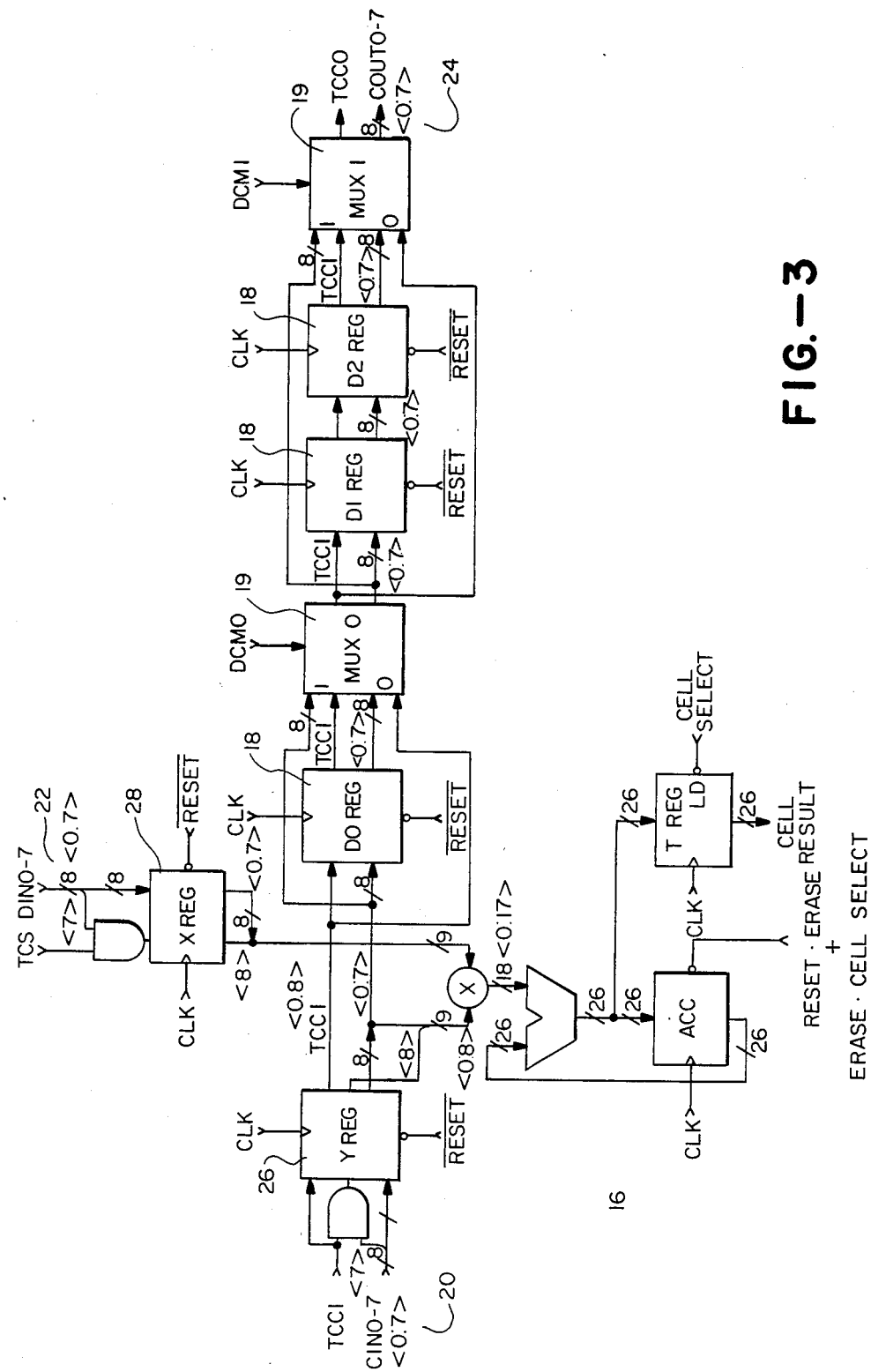
FIG. 3 is a functional block diagram of one cell in the DFP circuit of FIG. 2.

The invention has been reduced to practice in a digital filter processor device designated ZR33481 to be announced by Zoran Corporation, Assignee of the application. FIG. 1 is a logic symbol diagram and pin definition for the device. The device 10 comprises four multiplier/accumulator (MAC) stages cascaded internally and a shift and add output stage, all in a single integrated circuit. Each MAC stage contains an 8×8 bit multiplier. This multiplier may operate in 4 modes—according to the mode bit of the multiplicands: 2's complement×unsigned, 2's complement×2's complement, unsigned×unsigned, unsigned×two's complement, a 26 bit accumulator and three decimation registers. The output stage contains an additional 26 bit accumulator which can add the contents of any MAC stage accumulator to the output stage accumulator shifted right by 8 bits. This feature is used in implementing more than 8 bits MAC (data or coefficients) with several cells. As will be described below, the DFP can be configured to process expanded coefficient and word sizes. Multiple circuits can be cascaded for larger filter lengths at up to 20 MHz sample rate or a one or more DFP circuits can process larger filter lengths at less than 20 MHz. The architecture permits processing filter lengths up to 1028 taps with no overflows. The circuit supports unsigned or two's complement arithmetic, independently selectable for coefficients and signal data.

Each cell (MAC stage) contains three resampling or decimation registers which permit output sample rate reduction at rates of one-half, one-third, or one-fourth the input sample rate. These registers also provide the capability to perform 3×3 or 4×4 convolutions for image processing applications using one DFP. A 256×256×8 image can be convolved with a 3×3 kernel in real time (i.e., 6.64 MHz video rate).

Before describing the circuit structure and function, the following interface signal descriptions for the logic symbol of FIG. 1 are provided:

| | |
|---|---|
| $V_{cc}$ | +5V power supply input (±5%) |
| $V_{ss}$ | Power supply ground input. |
| CLK | The CLK input provides the DFP system sample clock. The clock must have a 50% duty cycle. The maximum clock frequency is 20 MHz for the ZR33481. The minimum frequency is 200 KHz. |
| DIN 0-7 | These 8 inputs are the data sample input bus. Eight-bit data samples are synchronously input through these pins to the X REGISTER of each multiply-accumulate (MAC) cell of the DFP simultaneously. The $\overline{\text{DIENB}}$ signal enables loading, which is synchronous to the clock signal. |
| TCS | The TCS input determines the number system interpretataion of the data input samples on pins DIN0-7 as follows:<br>TCS = LOW — unsigned arithmetic<br>TCS = HIGH — 2's complement arithmetic |
| $\overline{\text{DIENB}}$ | A low on this input enables the data sample input bus (DIN 0-7) to all the MAC cells. A rising edge of the CLK signal occurring while $\overline{\text{DIENB}}$ is low will load the X REGISTER of every MAC cell with the 8-bit value present on DIN 0-7. A high on this input forces all the bits of the data sample input bus to zero; a rising CLK edge when $\overline{\text{DIENB}}$ is high will load the X REGISTER of every MAC cell with all zeros. This signal is delayed by one clock internal to the chip. Therefore it must be low during the clock cycle immediately preceding presentation of the desired data on the DIN 0-7 inputs. Detailed operation is shown on later timing diagrams. |
| CIN 0-7 | These 8 inputs are used to input the 8-bit coefficients. The coefficient is synchronously loaded into the Y REGISTER of MAC CELL0 if a rising edge of CLK occurs while $\overline{\text{CIENB}}$ is low. The $\overline{\text{CIENB}}$ signal is delayed by one clock as discussed below. |
| TCCI | The TCCI input determines the number system interpretation of the coefficient inputs on pins CIN 0-7 as follows:<br>TCCI = LOW — unsigned arithmetic<br>TCCI = HIGH — 2's complement arithmetic |
| $\overline{\text{CIENB}}$ | A low on this input enables the Y REGISTER of every MAC cell and the D registers (decimation) of every MAC cell according to the state of the DCM0-1 inputs. A rising edge of the CLK signal occuring while $\overline{\text{CIENB}}$ is low will load the Y REGISTER and appropriate D registers with the coefficient data present at their inputs. This provides the mechanism for shifting the coefficients from cell to cell through the chip. A high on this input freezes the contents of the Y REGISTER and the D REGISTERS, ignoring the CLK signal. This signal is delayed by one clock internal to the chip. Therefore it must be low during the clock cycle immediately preceding presentation of the desired coefficient on the CIN0-7 inputs. Detailed operation is shown in later timing diagrams. |
| COUT 0-7 | These 8 three-state outputs are used to output the 8-bit coefficients from MAC CELL3. These outputs are enabled by the $\overline{\text{COENB}}$ signal. These outputs may be tied to the CIN 0-7 inputs of the same DFP to recirculate the coefficients, or they may be tied to the CIN 0-7 inputs of another DFP to cascade DFP's for longer filter lengths. |
| TCCO | The TCCO three-state output determines the number system representation of the coefficients output on COUT0-7. It tracks the TCCI signal to this same DFP chip. It should be tied to the TCCI input of the next DFP in a cascade of DFP's for increased filter lengths. |
| $\overline{\text{COENB}}$ | A low on the $\overline{\text{COENB}}$ input enables the COUT 0-7 outputs and the TCCO output. A high on this input places all these outputs in their high impedance state. |
| DCM 0-1 | These two inputs determine the use of the internal decimation registers as follows:<br><br>| DCM 1 | DCM 0 | Decimation Function |<br>|---|---|---|<br>| 0 | 0 | Decimation registers not used |<br>| 0 | 1 | One decimation register is used |<br>| 1 | 0 | Two decimation registers are used |<br>| 1 | 1 | Three decimation registers are used |<br><br>The coefficients pass from cell to cell at a rate determined by the number of decimation registers used. When no decimation registers used, coefficients move from cell to cell on each clock. When one decimation register is used, coefficients move from cell to cell on every other clock, etc. These signals are delayed by one clock internal to the chip. |
| SUM 0-25 | These 26 three-state outputs are used to output the results of the internal MAC computations. Individual MAC results or the result of the shift-end-add output stage can be output. If an individual MAC result is to be output, the ADR0-1 signals select the MAC result. The SHADD signal determines whether the selected MAC result or the output stage adder result is output. The signals $\overline{\text{SENBH}}$ and $\overline{\text{SENBL}}$ enable the most significant and least significant bits of the SUM 0-25 result respectively. Both $\overline{\text{SENBH}}$ and $\overline{\text{SENBL}}$ may be enabled simultaneously if the system has a 26-bit or larger bus. However individual enables are provided to facilitate use with 16-bit bus. |
| $\overline{\text{SENBH}}$ | A low on this input enables result bits SUM 16-25. A high on this input places these bits in their high impedance state. |
| $\overline{\text{SENBL}}$ | A low on this input enables result bits SUM0-15. A high on this input places these bits in their high impedance state. |

| | |
|---|---|
| ADR Ø-1 | These two inputs select the one cell whose accumulator will be read through the output bus (SUM Ø-25) or added to the output stage accumulator. They also determine which accumulator will be cleared when $\overline{ERASE}$ is low. For selection of which accumulator to read through the output bus (SUM Ø25) or to add to the outputstage accumulator, these inputs are delayed by one clock internal to the chip. For clearing a single accumulator, the clearing occurs synchronously on the rising edge of the next CLK when $\overline{ERASE}$ is low. There is no internal delay of ADR 0-1 in this case. If the ADR Ø-1 lines remain at the same address for more than one clock, the output at SUM Ø-25 will not change to reflect any subsequent accumulator updates in the addressed cell. Only the result available during the first clock when ADR Ø-1 selects the cell will be output. This does not hinder normal operation since the ADR Ø-1 lines are changed sequentially. This feature facilitates the interface with slow memories where the output is required to be fixed for more than one clock. |
| SHADD | The SHADD input controls the activation of the shift and add operation in the output stage. This signal is delayed by one clock internal to the chip. Detailed explanation is given in the DFP Output Stage section. |
| $\overline{RESET}$ | A low on this input synchronously clears all internal registers, except the cell accumulators. It can be used with $\overline{ERASE}$ to also clear all the accumulators simultaneously. This signal is delayed by one clock internal to the chip. |
| $\overline{ERASE}$ | A low on this input synchronously clears the cell accumulator selected by the ADR Ø-1 signals. If $\overline{RESET}$ is also low simultaneously, all cell accumulators are cleared. Clearing an individual accumulator ($\overline{RESET}$ high) occurs on the next rising CLK edge. ERASE is not delayed by one clock for this operation. To clear all accumulators, ERASE is delayed by one clock internally to line up with $\overline{RESET}$. |

FUNCTIONAL DESCRIPTION

As illustrated in FIG. 2, the Digital Filter Processor (DFP) is composed of four filter cells 12 cascaded together and an output stage 14 for combining or selecting filter cell outputs. Each filter cell contains a multiplier-accumulator (MAC) 16 that may operate in four modes according to the multiplicands, as above noted, and several registers 18, as illustrated in FIG. 3. Each MAC multiplies an 8-bit (plus mode bit) coefficient 20 by an 8-bit (plus mode bit) data sample 22, adds this result to the 26-bit accumulator contents in MAC 16 and stores the 26-bit addition result back into the accumulator. The coefficient output at 24 of each cell is cascaded to the coefficient input of the next cell to its right.

DFP FILTER CELL

An 8-bit coefficient with a ninth sign mode bit 20 enters each cell through the Y REGISTER 26 on the left and exits the cell on the right. The coefficient may exit on the clock following its entrance, it may be frozen for any number of clocks or it may be delayed 1, 2 or 3 clocks by passing through one or more decimation registers 18. The decimation operation will be described in more detail later. The coefficient output 24 of each cell connects to the coefficient input of the cell to its right. In normal operation a sequence of coefficients is shifted from left to right through the chip one cell at a time.

The $\overline{CIENB}$ input signal controls the CIN 0-7 input bus. When $\overline{CIENB}$ is low a new coefficient is read into the leftmost cell and all the previous coefficients are *shifted* right (according to the decimation control, DCM0-1). If $\overline{CIENB}$ is high, the coefficients are frozen. The $\overline{CIENB}$ signal is delayed by one clock internal to the chip. Therefore it must be low during the clock cycle immediately preceding presentation of the desired coefficient on the CIN0-7 inputs. Detaled operation is shown in later timing diagrams.

The $\overline{COENB}$ input signal enables the COUT 0-7 and TCCO outputs for retrieving the right-most coefficient. These outputs are typically connected to the CINI-7 and TCCI inputs of another DFP chip for cascading to construct longer filters.

A data sample enters each cell through its X REGISTER 28 and is multiplied by the coefficient in the Y REGISTER. All four cells receive the same data sample simultaneously via the DIN 0-7 bus and sign mode. When low, the $\overline{DIENB}$ signal enables the DIN 0-7 bus to every cell X REGISTER simultaneously. When high, $\overline{DIENB}$ presents a zero value to every X REGISTER. The $\overline{DIENB}$ signal is delayed by one clock internal to the chip. Therefore it must be low during the clock cycle immediately preceding presentation of the data sample on the DIN 0-7 inputs. Detailed operation is shown in later timing diagrams.

When both $\overline{CIENB}$ and $\overline{DIENB}$ are high (inactive), the DFP is effectively in a wait mode; previous internal results remain unchanged except in the shift and add mode (SHADD).

The ERASE and RESET signals clear the DFP internal registers and state as follows:

| ERASE | RESET | CLEARING EFFECT |
|---|---|---|
| 1 | 1 | No clearing occurs, internal state remains same. |
| 1 | 0 | Reset only active, all registers except accumulators are cleared, including the internal pipeline registers. |
| 0 | 1 | Erase only active, the accumulator whose address is given by the ADR 0 inputs is cleared. |
| 0 | 0 | Both Reset and Erase active, all accumulators as well as all other registers are cleared. |

The $\overline{RESET}$ signal is delayed by one clock internally. The registers are actually cleared on the clock cycle immediately following the cycle during which $\overline{RESET}$ is asserted low. $\overline{ERASE}$ is also delayed by one clock internally. However, for clearing a single accumulator selected by ADR0-1, $\overline{ERASE}$ is not delayed.

DFP OUTPUT STAGE

Referring now to FIG. 4, the output stage consists of a 26-bit adder 30, 26-bit register 32, feedback multiplexer 34 from the register to the adder, and an output multiplexer 36.

The 26-bit output adder 30 can add any MAC cell accumulator result to the 18 most significant bits of the output buffer 32. This result is stored back in the output buffer. This operation takes place in one clock period. The 18 most significant bits of the output buffer are obtained by shifting (actually hardwired) the output buffer contents right 8 bits. The 8 LSBs are lost. The MAC cell accumulator used is selected by the ADR 0-1 inputs.

The 18 MSBs of the output buffer 32 actually pass through the zero mux 34 on their way to the output adder input. The zero mux is controlled by the SHADD input signal and selects either the output buffer 18 MSBs or all zeros for the adder input. A low on the SHADD input selects zero. A high on the SHADD input selects the output buffer MSBs, thus activating the shift and add operation. The SHADD signal is delayed by one clock internally.

The 26-bit results from either a cell accumulator or the output buffer are output on the SUM 0-25 bus 38. The output mux 36 determines whether the cell accumulator selected by ADR 0-1 or the output buffer is output on the bus. This mux is controlled by the SHADD input signal. Control is based on the state of the SHADD during two successive clocks, that is the output mux selection contains memory. If SHADD is low during a clock cycle and was low during the previous clock, the output mux selects the contents of the MAC cell accumulator addressed by ADR 0-1. Otherwise the output mux selects the contents of the output buffer.

If the ADR 0-1 lines remain at the same address for more than one clock, the output at SUM025 will not change to reflect any subsequent accumulator updates in the addressed cell. Only the result available during the first clock when ADR 0-1 selects the cell will be output. This does not hinder normal operation since the ADR 0-1 lines are changed sequentially. This feature facilitates the interface with slow memories where the output is required to be fixed for more than one clock.

The SUM 0-25 output bus is controlled by the $\overline{SENBH}$ and $\overline{SENBL}$ signals. A low on $\overline{SENBL}$ enables bits SUM 0-15. A low on $\overline{SENBH}$ enables bits SUM16-25. Thus all 26 bits can be output simultaneously if the external system has a 26-bit or larger bus. If the external system bus is only 16 bits, the bits can be enabled in two groups of 16 and 10 bits (sign extended).

DFP ARITHMETIC

Both data samples and coefficients can be represented as either unsigned or two's complement numbers. The TCS and TCCI input signals determine the type of arithmetic representation. Internally all values are represented by a 9-bit two's complement number. The value of the additional ninth bit depends on arithmetic representation selected. For two's complement arithmetic, the sign is extended into the ninth bit. For unsigned arithmetic, bit 9 is 0.

The multiplier output is 18 bits and the accumulator is 26 bits. The accumulator width determines the maximum possible number of terms in the sum of products without overflow. The maximum number of terms depends also on the number system and the distribution of the coefficient and data values. As a worst case assume the coefficients and data samples are always at their maximum absolute values. Then the maximum numbers of terms in the sum products are:

| Number System | Maximum Number of Terms |
| --- | --- |
| Two unsigned vectors | 1032 |
| Two 2's complement vectors | |
| 2 positive vectors | 2080 |
| 2 negative vectors | 2047 |
| 1 positive & 1 negative vector | 2064 |
| One unsigned & one 2's complement vector | |
| positive 2's complement vector | 1036 |
| negative 2's complement vector | 1028 |

For practical FIR filters, the coefficients are never all near maximum value, so even larger vectors are possible in practice.

BASIC FIR OPERATION

A sample, 20 MHz 4-tap FIR filter example serves to illustrate more clearly the operation of the DFP. The sequence table (FIG. 5) shows the results of the multiply accumulate in each cell after each clock. The coefficient sequence, $C_n$, enters the DFP 10 on the left and moves from left to right through the cells. The data sample sequence, $X_n$, enters the DFP 10 from the top, with each cell receiving the same sample simultaneously. Each cell accumulates the sum of products for one output point. Four sums-of-products are calculated simultaneously, but staggered in time so that a new output is available every system clock.

Figure 7:
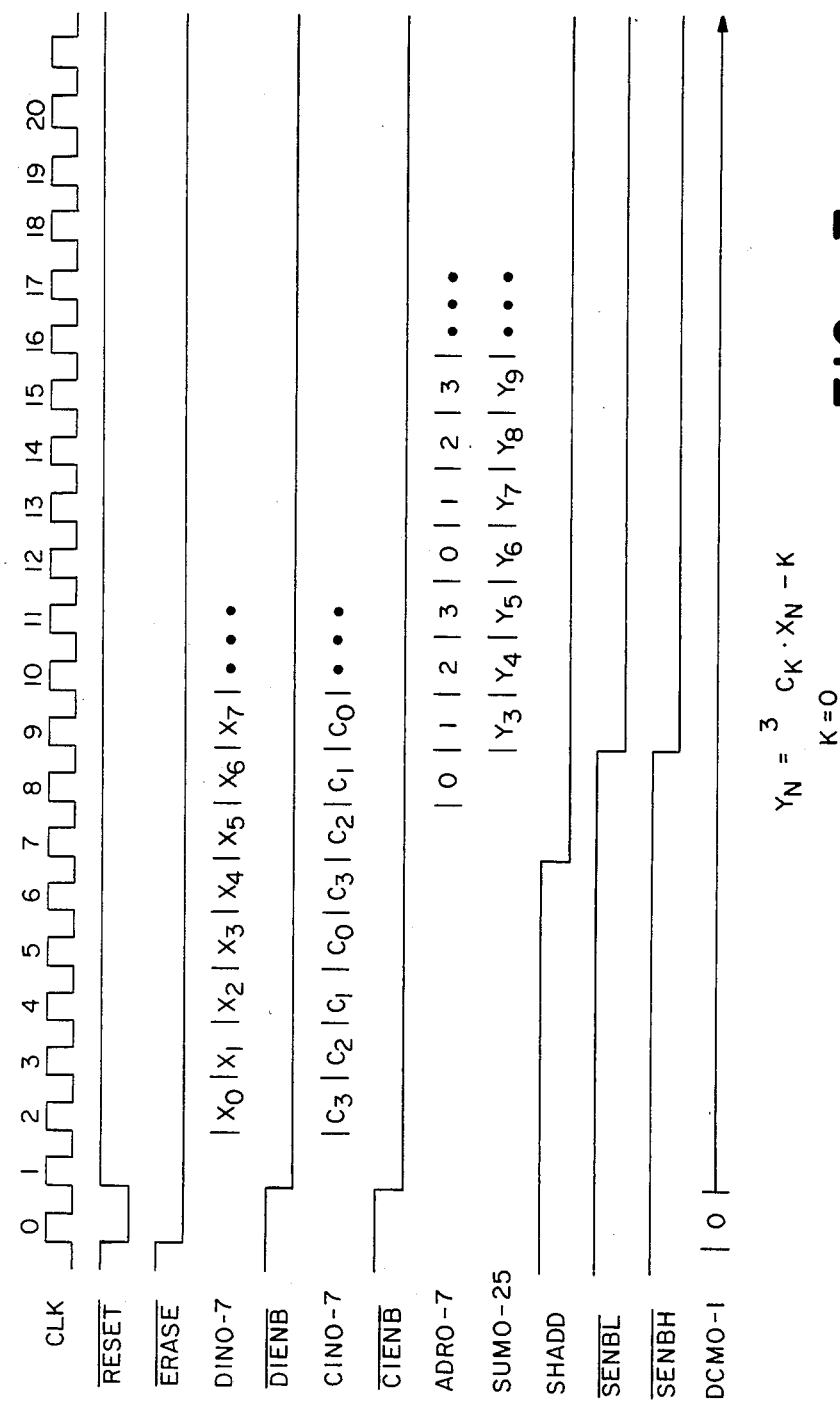
FIG. 7 is a timing diagram for the four tap filter operation.

The sequence table ignores pipeline details. Detailed operation of the DFP to perform a basic 4-tap, 8-bit coefficient, 8-bit data, 20 MHz FIR filter is best understood by observing the schematic (FIG. 6) and timing diagram (FIG. 7). The internal pipeline length of the DFP is three (3) clock cycles. Therefore the delay from presentation of data and coefficients (from memory 40) at the DIN0-7 and CIN0-7 inputs to a sum appearing at the SUM0-25 output is:

$$k+Td$$

where
k = filter length
Td = 3, the internal pipeline delay of DFP

After the pipeline has filled, a new output sample is available every clock. The delay to last sample output from last sample input is Td.

The output sums, Yn, shown in the timing diagram are derived from the sum-of-products equation:

$$Y(n) = C(0) \times X(n) + C(1) \times X(n-1) + C(2) \times X(n-2) + C(3) \times X(n-3)$$

Note that due to the pipeline, clock period #9 in the timing diagram corresponds to clock period #3 in the unpipelined state table above.

EXTENDED FIR FILTER LENGTH

Filter lengths greater than four taps can be created by either cascading together multiple DFP chips or "reusing" a single chip. Using multiple chips, an FIR filter of up to 1024 taps can be constructed to operate at a 20 MHz sample rate. Using a single chip clocked at 20 MHz, an FIR filter of up to 1024 taps can be constructed to operate at less than a 20 MHz sample rate. Combinations of these two techniques are also possible. Even more taps can be accommodated but with the risk of overflow.

CASCADE CONFIGURATION

Figure 8:
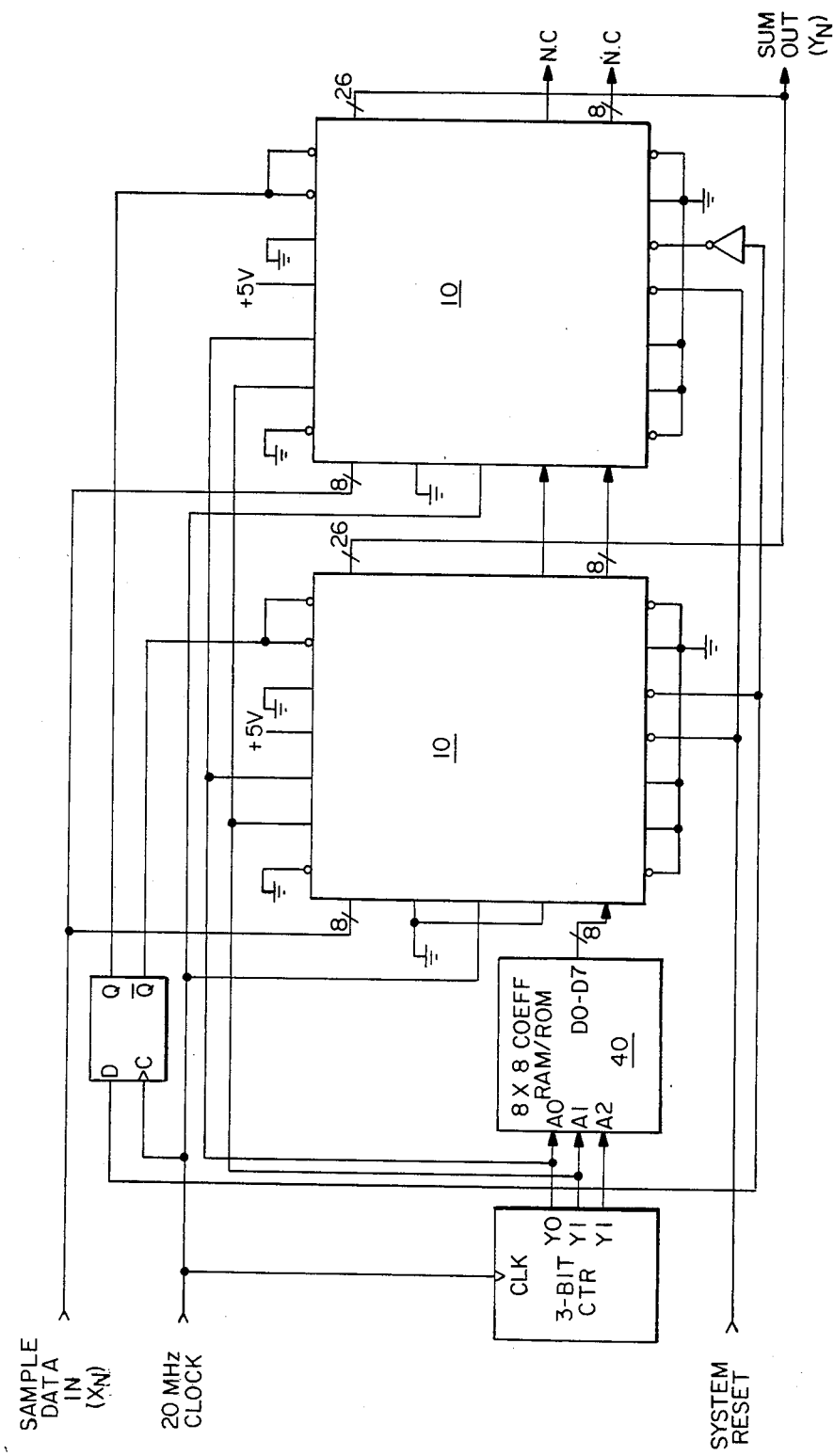
FIG. 8 is a functional block diagram of an eight tap FIR implemented by cascading two DFP's of the specified embodiment illustrated in FIG. 1.
Figure 9:
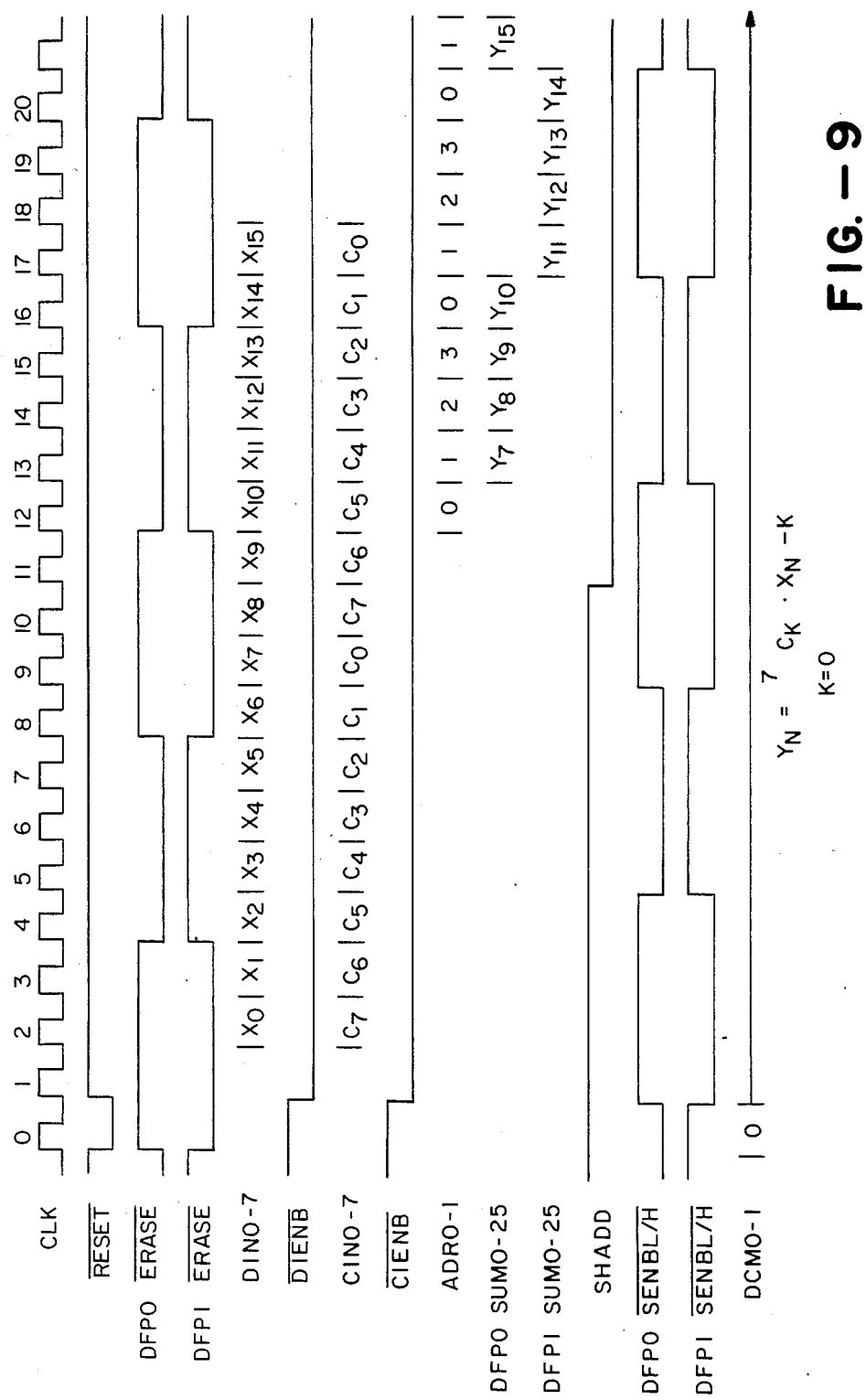
FIG. 9 is a timing diagram of the eight tap FIR cascade operation of FIG. 8.

To design a filter of length k>4, k/4 chips are cascade by connecting the COUT 0-7 outputs of the (i)th chip to the CIN 0-7 inputs of the (i+1)th chip. The DIN 0-7 inputs of all the chips are also tied together. A specific example of two cascaded chips illustrates the technique (FIG. 8). Timing (FIG. 9) is similar to the sample 4-tap FIR, except the $\overline{\text{ERASE}}$ and $\overline{\text{SENBL}}/\overline{\text{SENBH}}$ signals must be enabled independently for the two DFP chips in order to clear the correct accumulators and enable the SUM 0-25 output signals at the proper times.

SINGLE CHIP CONFIGURATION

Using a single DFP chip, a filter of length k>4 can be constructed by processing in k/4 passes as illustrated in the table shown in FIG. 10 for an 8-tap FIR. Each pass is composed of $Tp=3+k+Td$ cycles and computes 4 output samples. In pass i, the samples with indexes $(i-1)*4+1$ to $i*4$ enter the DIN 0-7 inputs. The coefficients Cl-Ck enter the CIN 0-7 inputs, followed by 3 zeros. As these zeros are entered, the result samples are output and the accumulators reset. Initial filling of the pipeline is not shown in this sequence table. Filter outputs can be put through a FIFO to even out the sample rate.

EXTENDED COEFFICIENT AND DATA SAMPLE WORD SIZE

The sample and coefficient word size can be extended by utilizing several DFP chips in parallel to get the maximum sample rate or a single chip with resulting lower sample rates. The technique is to compute partial products of 8×8 and combine these partial products by shifting and adding to obtain the final result. The shifting and adding can be accomplished with external adders (for full speed) or with the DFP's shift and add mechanism contained in its output stage (at reduced speed).

Before discussing these techniques, appropriate notation must be established. Consider the multiplication of two 16-bit numbers. Let $$C = C_M + C_L$$

where
$C_M$ = most significant byte,
$C_L$ = least significant byte $$X = X_M + X_L$$

where
$X_M$ = most significant byte
$X_L$ = least significant byte
Then $$C \times X = (C_M + C_L) \times (X_M + X_L) = C_M \times X_M + C_L \times X_M + C_M \times X_L + C_L \times X_L.$$

The partial product bits line up as follows:

MULTIPLE DFP WORD SIZE EXTENSION

Figure 11:
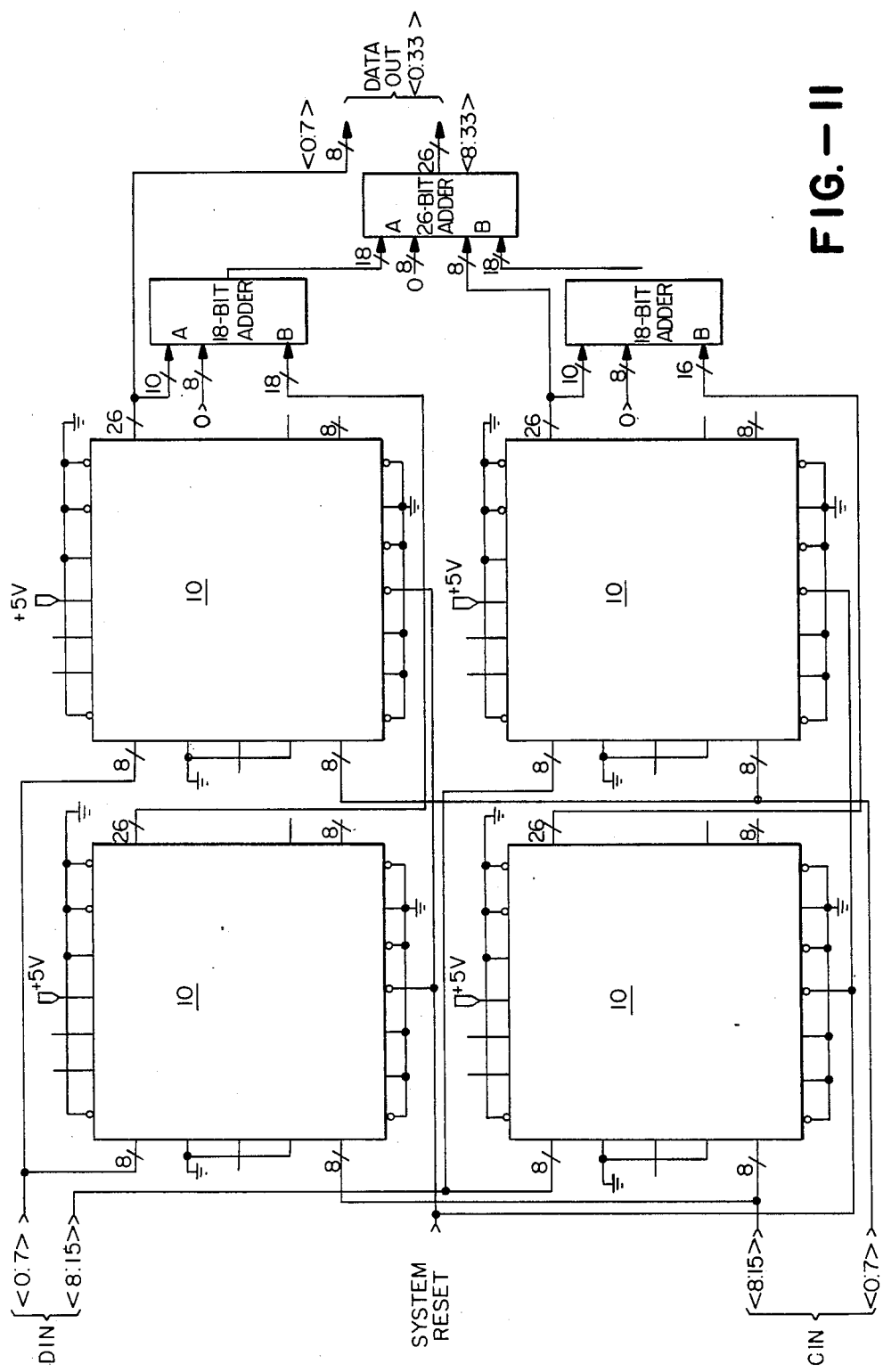
FIG. 11 is a schematic diagram of circuitry with DFP word size extension.

A fourth order FIR with 16-bit coefficients and data and 20 MHz sample rate can be constructed with four DFP chips 10 and three external adders 44 (FIG. 11). Different 8×8 partial products are accumulated in each DFP chip at a 20 MHz rate and combined by the external adders to form the result. The least portions ($X_L$ and $C_L$) are in unsigned mode.

SINGLE DFP WORD SIZE EXTENSION

A single 4-tap DFP can multiply word sizes up to n×32 bits with any number of bits. A single 4 tap DFP may be used, for example to implement 24×16 MAC or 8×32 MAC. The technique can be illustrated by the sample of a 16×16 multiplication.

Using the partial product notation above, consider the multiplication of two 16×16 numbers. Three MAC cells are used to accumulate three overlapping partial products. CELL 0 accumulates the LSBs, CELL1 the middle bits and CELL2 the MSBs. Finally the partial products are combined using the shift and add capabilities of the output stage. CELL 0 operates in unsigned mode. CELL1 is MIXED mode and CELL2 is two's complement mode.

The 16-bit operands are input one byte at a time in the sequence shown in FIG. 12. Detailed timing of 16×16 multiplication, including pipelining, is shown in FIG. 13.

DECIMATION/RESAMPLING

A useful function in many digital signal processing systems is sample rate reduction or decimation. Prior to decimation the signal must be low pass filtered to prevent aliasing when the sample rate is reduced. If, for example, decimation by a factor of 2 is desired, only every other output of the low pass filter is used. If only the needed outputs are calculated, the processing requirements are halved. FIR filters are particularly convenient for decimation since their output depends only on present and past inputs and not on past outputs.

Figure 15:
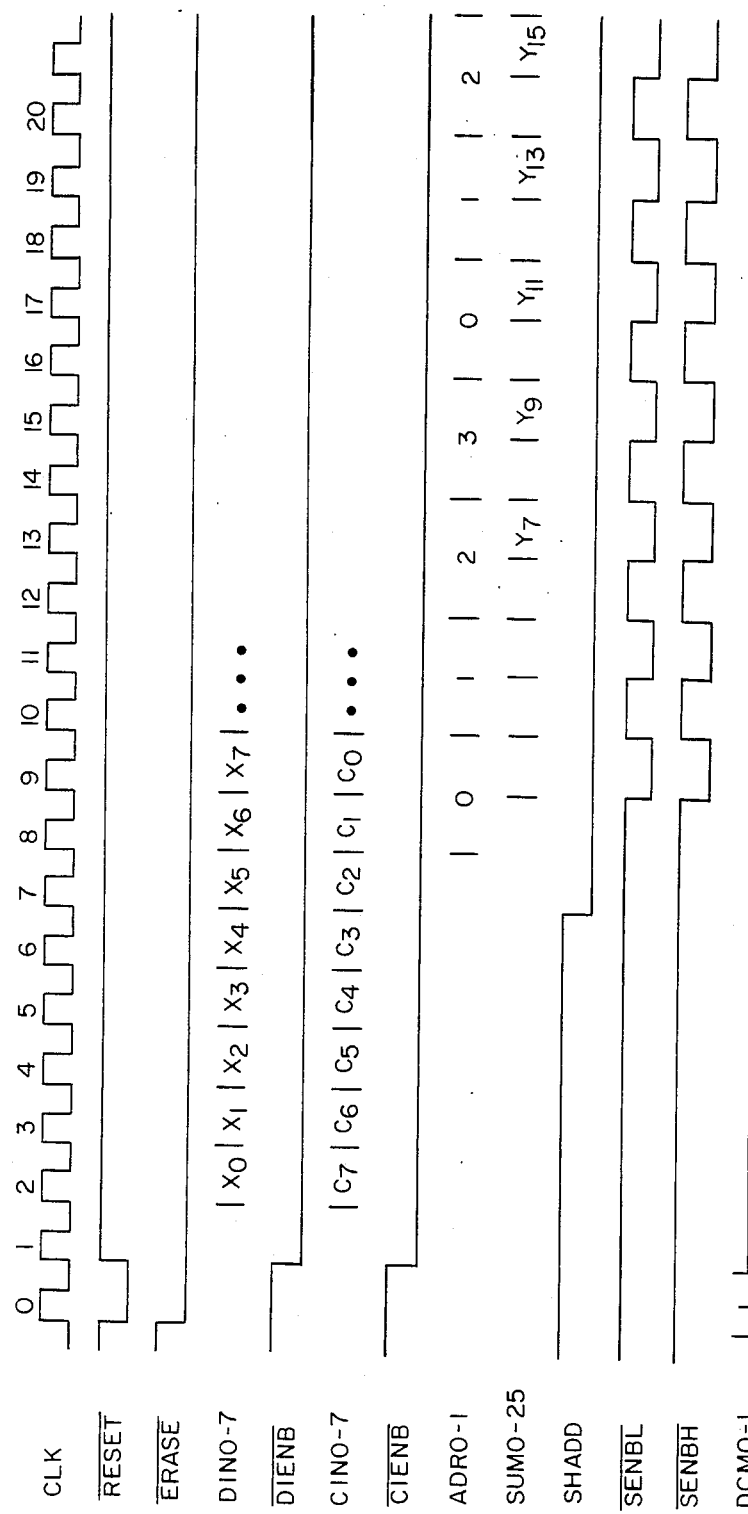
FIG. 15 is a timing diagram of the operation illustrated in the table of FIG. 14.

The DFP of FIG. 2 provides a mechanism for decimating by factors of 2, 3 or 4. From the DFP filter cell block diagram (FIG. 3), note the three D registers 18 and two multiplexers 19 in the coefficient path through the cell. These allow the coefficients to be delayed by 1, 2, or 3 clocks through the cell. The sequence table (FIG. 14) for a decimate-by-two filter illustrates the technique (internal cell pipelining ignored for simplicity):

Detailed timing for a 20 MHz input sample rate, 10 MHz output sample rate (i.e. decimate-by-two), 8-tap FIR filter, including pipelining, is shown in FIG. 15.

IMAGE CORRELATION WITH THE DFP

The decimation registers can be used to provide a 3×3 or 4×4 correlation with one DFP device (FIG. 16). In the 4×4 application for example, the 16 kernel coefficients are stored properly interleaved within the decimation registers and recycled as the DFP is clocked. The image pixels are entered in column-scanned order into the DFP data input. Each DFP MAC cell accumulates the correlation sum for a single image point. Four points are being accumulated simultaneously, but overlapped. Once the pipeline is full, a new correlation result is available every four clocks. Hence the correlation proceeds at a rate of 20 MHz/4=5 M points/sec. For a 3×3 correlation, the rate is 6.67 M points/sec. In a similar manner image convolution may be implemented with the DFP device.

OTHER APPLICATIONS

The high performance and cascadability of the DFP is very attractive for implementing various functions in a radar system. In a typical radar system the DFP can implement the matched filter pulse compressor as well as various other digital filters in the system. Other applications include adaptive filters, Butterfly computations, echo cancellation, and complex multiplications.

Thus while the invention has been described with reference to a specific embodiment and specific applications the description is illustrative of the invention and not to be construed as limiting the invention. Various modifications and applications may occur to those skilled in the art without departing from the true spirit and scope of the invention as defined by the appended claims.

What is claimed is:

1. A digital filter processor comprising
   a plurality of processing cells, each cell including a data register, a coefficient register, a multiplier-accumulator for processing and accumulating the contents of said data register and the contents of said coefficient register and producing an output,
   means connecting said plurality of cells whereby a coefficient is serially translated to each cell for multiplying with a data word,
   means for applying data in parallel to all cells, and
   multiplex means connected to the outputs of said accumulators for receiving outputs from all cells, said multiplex means including a multiplexer for selectively receiving an output from each cell, an output stage for summing said outputs, said output stage including an adder for shifting and adding said outputs from said cells.

2. The digital filter processor as defined by claim 1 and including address means connected to all cells for selecting a cell output for application to said multiplexer.

3. The digital filter processor as defined by claim 2 and further including a coefficient input for receiving coefficients for application to said plurality of cells serially, and a coefficient output for transmitting coefficients after application to all of said cells, whereby a plurality of said digital filter processors can be concatenated to increase the number of coefficients for multiplication with data.

4. A digital filter processor comprising
   a plurality of processing cells, each cell including a data register, a coefficient register, a multiplier-accumulator for processing and accumulating the contents of said data register and the contents of said coefficient register and producing an output, said multiplier/accumulator including a multiplier for receiving and multiplying the contents of said data register and the contents of said coefficient register and producing an output, a first adder having a first and second inputs and an output, means connecting the output of said multiplier to said first input, a first accumulator having an input connected to said output of said adder and having an output connected to said second input,
   means connecting said plurality of cells whereby a coefficient is serially translated to each cell for multiplying with a data word,
   means for applying data in parallel to all cells,
   multiplex means connected to the outputs of said accumulators for receiving outputs from all cells, and
   an output stage for summing said outputs.

5. The digital filter as defined by claim 4 wherein said multiplex means includes a multiplexer for selectively receiving an output from each cell, and a second adder and a second accumulator for shifting, adding and accumulating outputs from all cells.

6. The digital filter as defined by claim 5 and including address means connected to all cells for selecting a cell output for application to said multiplexer.

7. The digital filter as defined by claim 6 and further including a coefficient input for receiving coefficients for application to said plurality of cells serially, and a coefficient output for transmitting coefficients after application to all of said cells, whereby a plurality of said digital filter processors can be concatenated to increase the number of coefficients for multiplication with data.

8. The digital filter processor as defined by claim 7 wherein each cell includes a plurality of registers and at least one multiplier serially connected with said coefficient register whereby a coefficient of one cell can be selectively delayed before being passed to an adjacent cell for sample rate reduction.

9. A method of filter processing of digital data using a finite impulse response defined by a plurality of coefficients comprising the steps of
   providing a plurality of multiplier/accumulator cells,
   providing data words in parallel to all cells in sequence,
   providing coefficients serially to all cells in sequence including optionally delaying said coefficients between cells for sample rate reduction,
   multiplying a data word by coefficients in each cell to obtain products, and
   optionally accumulating the products from selected cells including selectively shifting the product of a cell and adding the shifted product to the product from another cell.

10. The method as defined by claim 9 wherein said data words and said coefficients include sign mode bits.

11. The method as defined by claim 9 wherein said step of optionally accumulating the products is not exercised and products from said selected cells are provided as filter outputs.

* * * * *